United States Patent
Dorfner (10) Patent No.: US 9,946,410 B2
(45) Date of Patent: Apr. 17, 2018

(54) SYSTEM AND METHOD FOR ENERGY EFFICIENT MEASUREMENT OF SENSOR SIGNAL

(71) Applicant: Microchip Technology Incorporated, Chandler, AZ (US)

(72) Inventor: Andreas Dorfner, Munich (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 307 days.

(21) Appl. No.: 14/204,601

(22) Filed: Mar. 11, 2014

(65) Prior Publication Data

US 2014/0267157 A1 Sep. 18, 2014

Related U.S. Application Data

(60) Provisional application No. 61/800,816, filed on Mar. 15, 2013.

(51) Int. Cl.
| | |
|---|---|
| *G06F 3/045* | (2006.01) |
| *G06F 3/044* | (2006.01) |

(Continued)

(52) U.S. Cl.
CPC ............... *G06F 3/044* (2013.01); *G01D 5/24* (2013.01); *H03K 17/955* (2013.01); *H03K 2217/96073* (2013.01); *H03K 2217/960705* (2013.01)

(58) Field of Classification Search
CPC ...... G06F 3/0412; G06F 3/0416; G06F 3/046; G06F 3/044
See application file for complete search history.

(56) References Cited

U.S. PATENT DOCUMENTS

| 8,436,494 B2 | 5/2013 | Yamauchi et al. ............ 307/112 |
| 9,134,850 B2 | 9/2015 | Ye et al. |

(Continued)

FOREIGN PATENT DOCUMENTS

| CN | 101889394 A | 11/2010 | ............ H03K 17/96 |
| CN | 102348576 A | 2/2012 | ............... B60N 2/48 |

(Continued)

OTHER PUBLICATIONS

International Search Report and Written Opinion, Application No. PCT/US2014/025235, 10 pages, dated May 28, 2014.

(Continued)

*Primary Examiner* — Nicholas Lee
*Assistant Examiner* — Ngan T Pham Lu
(74) *Attorney, Agent, or Firm* — Slayden Grubert Beard PLLC (57) ABSTRACT

A method for improving robustness of a capacitive sensor system has the following steps: a) operating the capacitive sensor system, wherein received sensor signals are filtered by a band-pass filter having a band-pass having a first center frequency; b) polling sensor data at a first rate using the sensor system; c) determining whether a polled sensor value is meeting a predetermined threshold; d) if the predetermined threshold is met: d1) polling sensor data at a second rate being higher than the first rate using the sensor system; d2) verifying that sensor data polled at the second rate are consistent; d3) if the sensor data polled at the second rate are inconsistent, then repeating at least step d2) wherein said band-pass filter is controlled to have a second center frequency.

24 Claims, 10 Drawing Sheets

(51) Int. Cl.
*G01D 5/24* (2006.01)
*H03K 17/955* (2006.01)

(56) References Cited

U.S. PATENT DOCUMENTS

| | | | | |
|---|---|---|---|---|
| 2008/0122458 A1* | 5/2008 | Lenz | H03K 17/955 | 324/687 |
| 2010/0277284 A1 | 11/2010 | Brown et al. | | 340/10.3 |
| 2010/0321034 A1* | 12/2010 | Hargreaves | H03K 17/955 | 324/612 |
| 2011/0050638 A1* | 3/2011 | Lee | G06F 1/3203 | 345/174 |
| 2011/0063229 A1* | 3/2011 | Krah | G06F 3/0418 | 345/173 |
| 2011/0063993 A1* | 3/2011 | Wilson | G06F 3/044 | 370/254 |
| 2012/0041648 A1 | 2/2012 | Yamaguchi et al. | | 701/49 |

FOREIGN PATENT DOCUMENTS

| | | | |
|---|---|---|---|
| CN | 102799321 A | 11/2012 | G06F 3/044 |
| WO | 2009/150618 A2 | 12/2009 | |
| WO | 2010/039741 A1 | 4/2010 | G08B 13/14 |
| WO | 2012/0164240 A2 | 12/2012 | G01D 5/14 |

OTHER PUBLICATIONS

Chinese Office Action, Application No. 201480014826.1, 22 pages, dated Nov. 30, 2016.
Chinese Office Action, Application No. 201480014826.1, 24 pages, dated Aug. 9, 2017.
Taiwan Office Action, Application No. 103109487, 19 pages, dated Jun. 29, 2017.
Taiwan Office Action, Application No. 103109487, 21 pages dated Dec. 20, 2017.

* cited by examiner

SYSTEM AND METHOD FOR ENERGY EFFICIENT MEASUREMENT OF SENSOR SIGNAL

CROSS-REFERENCE TO RELATED APPLICATIONS

This application claims the benefit of U.S. Provisional Application No. 61/800,816 filed on Mar. 15, 2013, which is incorporated herein in its entirety.

TECHNICAL FIELD

The present disclosure relates to measurement of sensor signals, and, more particularly, to energy efficient measurement of sensor signals.

BACKGROUND

E-field sensor systems or any other sensor system that are subject to noise or interference must be robust in operation when in the presence of electromagnetic interference (EMI) noise, e.g., radio frequency noise from switch mode battery chargers, compact fluorescent lamps (CFL), lamp dimmers, etc. Noise influences the quality of signal reception, and the noise may influence the received data signal that may cause false (improper) sensor detection or missing detection of desired sensor data. Noise power at and near the sensor scanning frequency is a crucial factor in degrading reception performance. While the noise frequency(ies) is a given, the scanning frequency of a wireless sensor system can be changed. Code size and current consumption in a wireless sensor system device are critical since mobile and remote battery powered applications have limited battery capacity, and limited computing power and memory for data processing and storage capabilities.

Hence there is a need to enhance robustness in sensor system, such as, for example, e-field wireless sensor system, in the presence of noise.

SUMMARY

According to various embodiments, the robustness of a sensor signal in a system in the presence of noise may be enhanced through scanning frequency switching during event validation, e.g., touch/no-touch of a touch pad or screen. Hence, according to various embodiments, a scan frequency can be switched when excess noise causes signal variations (poor signal-to-noise ratio) during an event validation.

According to an embodiment, a method for improving robustness of a capacitive sensor system may comprise the steps of: a) operating the capacitive sensor system, wherein received sensor signals are filtered by a band-pass filter having a band-pass having a first center frequency; b) polling sensor data at a first rate using the sensor system; c) determining whether a polled sensor value is meeting a predetermined threshold; d) if the predetermined threshold is met: d1) polling sensor data at a second rate being higher than the first rate using the sensor system; d2) verifying that sensor data polled at the second rate are consistent; d3) if the sensor data polled at the second rate are inconsistent, then repeating at least step d2) wherein said band-pass filter is controlled to have a second center frequency.

According to a further embodiment, the sensor system may be configured to be operated at a system frequency that matches a center frequency of the band-pass filter and further operable to switch between system frequencies that match said first and second center frequency. According to a further embodiment, the method may further include repeating steps b)-d) if the sensor data polled at the second rate are inconsistent in step d3). According to a further embodiment, the method may further comprise: if the sensor data polled at the second rate are consistent, then changing a state of a sensor output signal. According to a further embodiment, different threshold values can be applied when determining a switch from a first state to a second state and a switch from a second state to a first state. According to a further embodiment, a system frequency can be the first or second frequency, respectively. According to a further embodiment, a system frequency can be within a pass-band of the band-pass filter. According to a further embodiment, the sensor system may comprise a proximity sensor comprising a first transmission electrode receiving a carrier signal having the first or second frequency. According to a further embodiment, the sensor output signal may indicate a touch or no-touch. According to a further embodiment, the first polling rate may be between 20 ms and 200 ms or between 10 ms and 100 ms. According to a further embodiment, the second polling frequency may be higher than 100 Hz. According to a further embodiment, the method may further comprise a reception electrode, wherein an quasi-static alternating electric field if formed between the transmission electrode and the reception electrode and an attenuation of the signal at the reception electrode is measured.

According to another embodiment, a capacitive sensor system may comprise: a capacitive sensor electrode arrangement; a band-pass filter receiving sensor signals from said capacitive sensor electrode arrangement, wherein the band-pass filter having a band-pass with a first center frequency; an evaluation unit configured: to poll sensor data at a first rate using the capacitive sensor electrode arrangement; determine whether a polled sensor value is meeting a predetermined threshold and if the predetermined threshold is met: to poll sensor data at a second rate being higher than the first rate using the sensor system; to verify that sensor data polled at the second rate are consistent and if the sensor data polled at the second rate are inconsistent, to control the band-pass filter to switch to a second center frequency.

According to a further embodiment of the system, the capacitive sensor electrode arrangement can be configured to operate at a variable system frequency which can be switched to match said first or second center frequency. According to a further embodiment of the system, a sensor output signal may change states if the sensor data polled at the second rate are consistent. According to a further embodiment of the system, different threshold values can be applied when determining a switch from a first state to a second state and a switch from a second state to a first state. According to a further embodiment of the system, a system frequency can be the first or second frequency, respectively. According to a further embodiment of the system, a system frequency can be selected to be within the band-pass of the band-pass filter. According to a further embodiment of the system, the capacitive sensor electrode arrangement may comprise a proximity sensor comprising a first transmission electrode receiving a carrier signal having the first or second frequency. According to a further embodiment of the system, the sensor output signal may indicate a touch or no-touch. According to a further embodiment of the system, the first polling rate can be between 20 ms and 200 ms or between 10 ms and 100 ms. According to a further embodiment of the system, the second polling frequency is higher than 100 Hz. According to a further embodiment of the system, the system further may comprise a reception electrode, wherein an quasi-static alternating electric field if formed between the transmission electrode and the reception electrode and an attenuation of the signal at the reception electrode is measured.

According to yet another embodiment, a method for operating a portable device with a capacitive sensor system may comprise the steps of: a) switching the device into a low power mode; b) operating the capacitive sensor system at a first frequency, wherein received sensor signals are filtered by a band-pass filter having a band-pass matching said first frequency; c) polling sensor data at a first rate using the sensor system operating at the first frequency;

d) determining whether a polled sensor value is meeting a predetermined threshold; e) if the predetermined threshold is met: e1) polling sensor data at a second rate being higher than the first rate using the sensor system operating at the first frequency; e2) verifying that sensor data polled at the second rate are consistent; e3) if the sensor data polled at the second rate are inconsistent, then repeating at least step e2) wherein the sensor system is operated at a second frequency and said band-pass filter is controlled to match said second frequency; f) if in step e3) it has been verified that the sensor data polled at the second rate are consistent, then switching the portable device from a low power mode into a normal operating mode.

DETAILED DESCRIPTION

For example, an e-field sensor system for approach detection uses a three-dimensional electric field sensor arrangement and generally produces a quasi-static alternating electric field, for example, using a 100 kHz signal. Such an electric field extends, for example, vertically more than 10 cm from the device generating the field. A user can enter this field without touching the device, for example with a hand, and gestures performed by a user will disturb the electric field. Such distortions can then be measured by a sensor arrangement and dynamic and static characteristic determined by the arrangement can be used to conclude which type of gesture has been performed.

Figure 1:
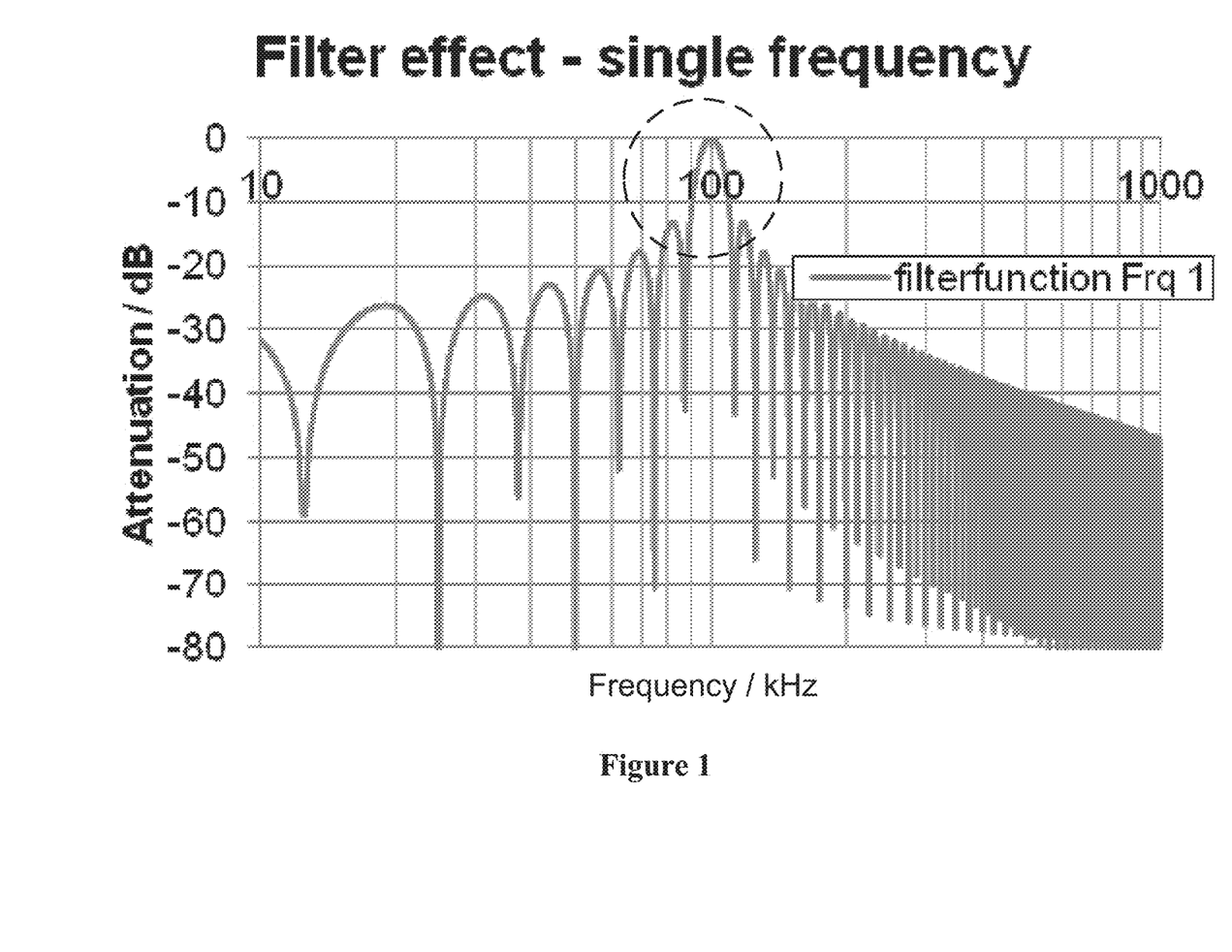
FIG. 1 shows a filter function of a single band-pass filter.

Such a system may typically use direct sampling at a first working frequency for detection of an approach of a user. Referring to FIG. 1, depicted is a frequency response diagram of a filtering effect on a single frequency, according to the teachings of this disclosure. As shown in FIG. 1, a band-pass filter with a center frequency of 100 kHz is applied. This allows focusing on the carrier signal generated by the transmitter electrode while filtering out all other possible signals that may disturb the carrier frequency as disturbing noise and interference signals at or near the first working frequency may degrade proper operation of the sensor system. Single frequency filtering may be effective, but not effective enough to meet the new EMC standard IEC61000-4-6 since the noise levels may be high compared to the working signal level.

Figure 2:
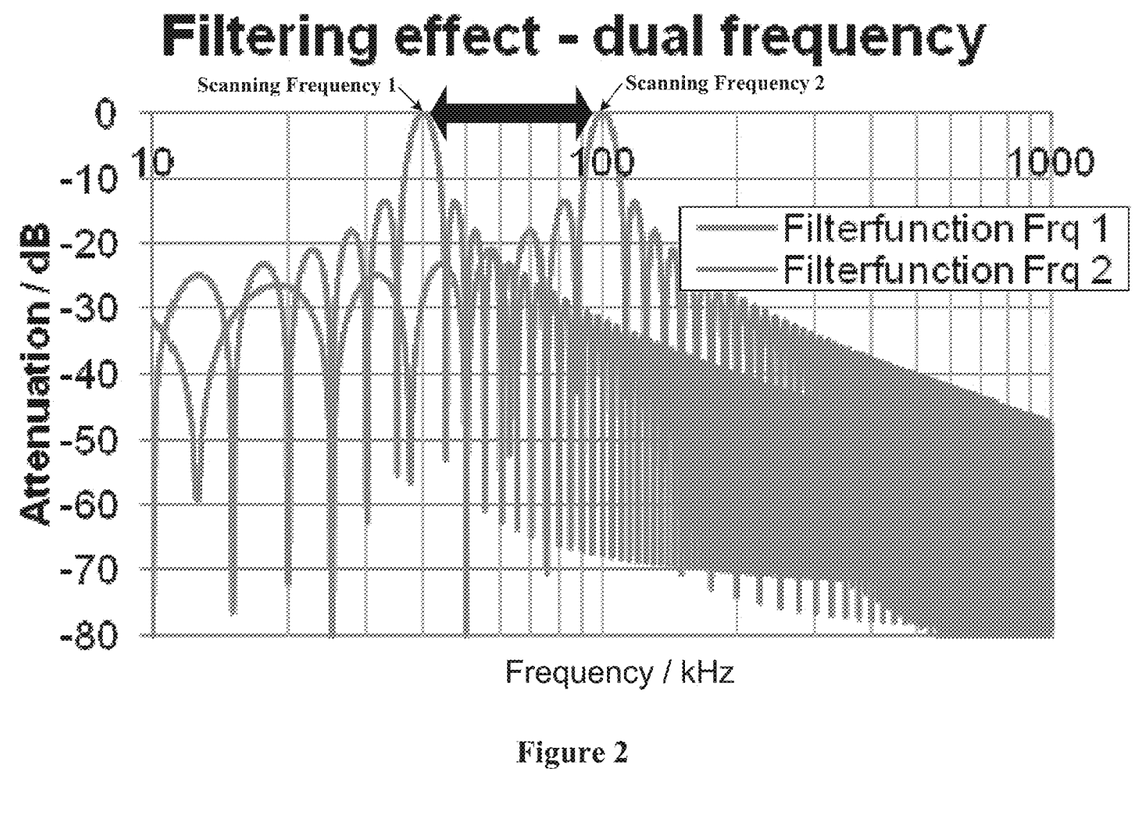
FIG. 2 shows the filter functions of a two band-pass filter with different center frequencies.

In order to enhance the filter effect without increasing power consumption of the sensor device, a second working frequency may be introduced. Referring to FIG. 2, depicted is a frequency response diagram of filtering effects on dual frequencies, according to a specific example embodiment of this disclosure. Thus, FIG. 2 shows the principal filter effect over a set of sensor values taken at a certain scanning frequency. The length of the sensor value set defines the sharpness of the filter function. Noise which is close to the scanning frequency will cause a signal variation due to the low noise attenuation. The working frequency should be chosen with a good filter characteristic against the noise frequency.

In this specific embodiment, the first band-pass frequency is at 100 kHz whereas the second band-pass frequency is at 40 kHz. However, a higher frequency than the first frequency and a lower frequency as the second frequency may be chosen as well. The sensor system will switch the band-pass filtering from the first working frequency to the second working frequency if the measurement at the first working frequency was degraded (harmed) and surpassed a threshold due to noise and/or interference (disturbing) signal(s) at or near the first working frequency. The second working frequency has its own filter characteristic so that an interference (disturbing) signal(s) at or near the first working frequency will be suppressed when receiving at the second frequency. And when an interference (disturbing) signal(s) is at or near the second working frequency it will be suppressed when receiving at the first working frequency. When switching from the first to the second frequency, the system operating frequency, i.e., the frequency of the quasi-static alternating electric field will of course change simultaneously. Thus, in the embodiment shown in FIG. 2, the transmitter electrode will receive a 40 kHz carrier signal instead of a 100 kHz signal when the system detects that a disturbing source is present near the first frequency.

The principle described above is not limited to sensor systems that uses a transmitter and receiver but can be applied to any type of sensor system that operates with or without a predefined system frequency. For example, the above described method can be applied to a capacitive sensor system measuring a self or a mutual capacitance, for example, using a capacitive voltage divider measurement, a relaxation oscillator, etc. Thus, if the sensor system does not work with a specific frequency, then when switching the band-pass frequency, a change of a respective system frequency is of course not necessary.

In the embodiment using an e-field sensor described above, the center frequency of the band-pass filter may match the first and second frequency, respectively. In some embodiments, the filters may be designed to have a relatively narrow bandpass. For example, a sensor which is designed to detect the approach of a hand at a high distance will require higher sensor resolution/quality and thus a relatively narrowed bandpass filter. However, the band-pass filter may also be designed to have a pass-band that merely includes the respective operating frequency of the system. Again, as stated above, some sensor system may not require a specific operating frequency and thus, the band-pass may be primarily designed to exclude, for example, known noise sources.

The frequency switching from one working frequency to the other working frequency may be initialized only during an event validation. An event may be a touch when the signal is crossing a threshold for touch/no-touch detection. During the event validation, there may be a set of measurements (history) that have to meet the condition for indicating a state change (makes the sensor system more reliable). All measurements of this set have to be above the threshold to switch the sensor state on. Due to a disturbance near by the selected working frequency, e.g., noise and/or interference, there may be a variation within the signal so that not all measurements in this set meet the required threshold condition. This occurrence may initialize the working frequency switch. It is very important to evaluate the signal variation in the set of measurements during validation and not during normal runtime operation. This is because the normal sensor polling (e.g., sampling) frequency is much slower than the polling frequency for the validation measurement. The slower polling frequency may lead to a dynamic in the history when somebody is interacting with the sensor so that no difference could be determined between the interfering signal and user interaction. While a user interaction with the higher polling frequency (validation) would not lead to a dynamic in the history. The polling frequency during a validation measurement is much higher than the normal polling frequency to ensure a fast reaction time since the normal polling frequency is much slower to conserve power consumption during normal runtime.

According to some embodiments, the polling frequency may not be changed once an interfering noise source has been detected. In other words, the system stays within the high polling frequency while switching to a different frequency range. According to other embodiments, once an interfering event has been detected, the system may assume no event has actually occurred due to the failed validation and not only switch the band-pass filter frequency and if necessary the operating frequency of the system but also switch back to the slower polling frequency.

Figure 3:
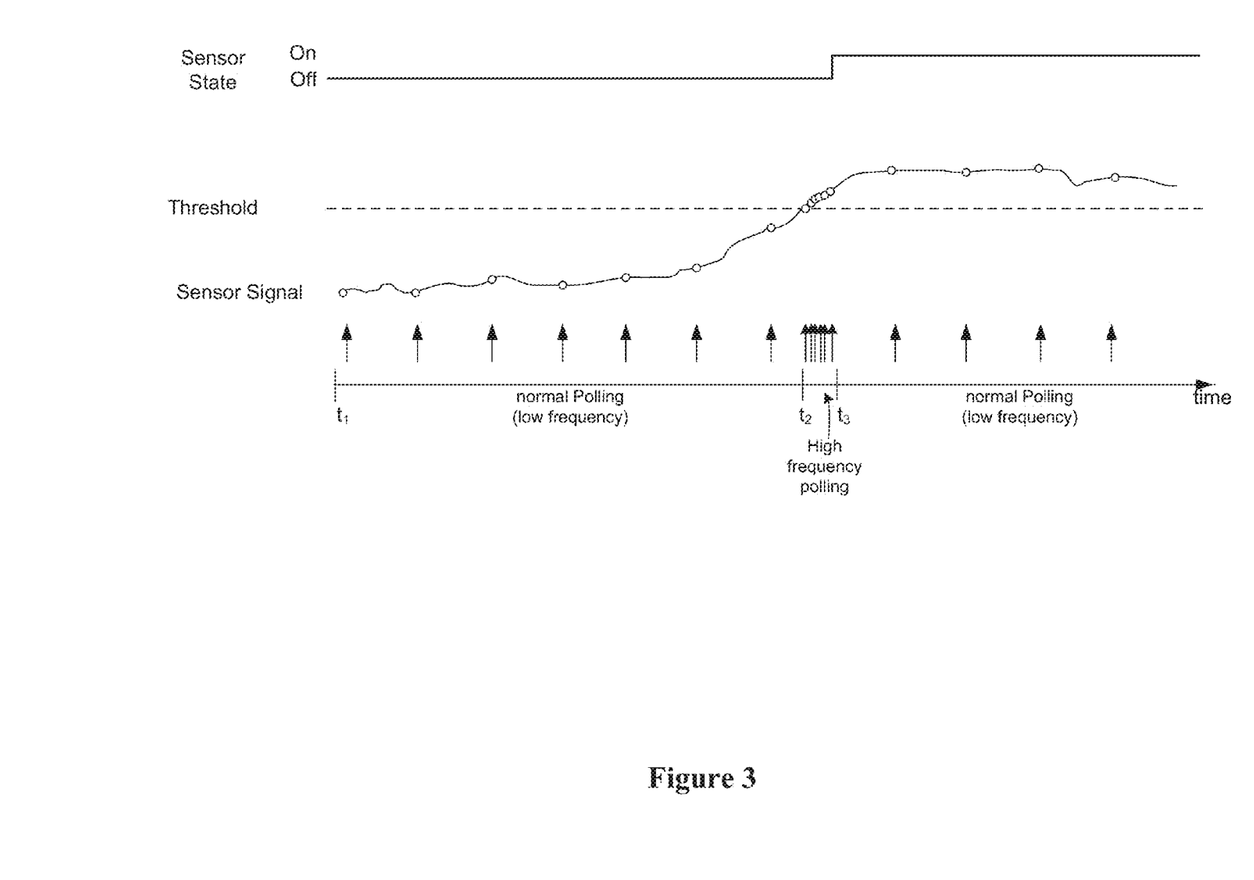
FIG. 3 shows the timing of polling sensor data during normal polling and verification polling.

FIG. 3 shows this scenario in more detail. The dashed line indicates a threshold which the sensor signal needs to surpass to initiate a polling at a higher frequency. As shown in FIG. 3 during time interval $t_1$-$t_2$ normal polling at a first frequency takes place. Then during time period $t_2$-$t_3$ high polling takes place at a second frequency. From time $t_3$ on, the system returns to normal polling at the first frequency. After high frequency polling has been initiated at $t_2$, all measurements of the high frequency polling are above the threshold in the example shown in FIG. 3. Thus, the system switches the sensor state from "off" to "on" and continues polling with the normal frequency. FIG. 3 shows a switch of the sensor output signal from a first to a second state. A switch back to the first state from the second state would be determined in a similar fashion using another verification period for polling at a higher frequency when the signal level falls below the threshold. According to other embodiments, a hysteresis may be applied to have different thresholds to avoid oscillations.

A frequency switch may be initialized also if all validation measurements meet the event condition, e.g., all sensor signal values are above the threshold, but the variation within the set of validation measurements is too high. The filter effect of each working frequency is shown in FIG. 2. By adding a second working frequency the combined filter effect will be increased. An advantage of having two working frequencies is the advanced filtering effect without increasing filter length, thereby no increasing power consumption by the sensor system.

In an embodiment of an e-field sensor system as mentioned above, generally the transmission and sensor electrodes are often simply formed by flat metal plates. For example, a printed circuit board can be patterned to form such electrodes by a copper layer. In case the electrodes need to be arranged above each other, different conductive layers of a multi-layered PCB may be patterned accordingly to form such electrode arrangements. The e-field sensor which is used for user approach detection may normally be polled in a frequency range of from about 1 Hz to about 100 Hz, so that the sensor will take a set of measurements every 10 milliseconds to 1000 milliseconds. However, other rates may apply according to different embodiments. A variation in the sensor signal from a measurement set to the next measurement set may be caused by user interaction with the sensor or by noise. The scanning (working) frequency should be changed only if noise caused the variation in the signal. The differentiation between variation caused by the user interaction or caused by noise cannot be determined at this polling (sampling) frequency. According to another requirement, the polling frequency should be as low as possible to ensure low power consumption by the sensor.

Therefore, once the sensor value has crossed a detection threshold, a state change of the sensor is anticipated, e.g., from no touch to touch or visa versa. At this special event the measurement will be repeated at a higher polling frequency to confirm the state change as shown in FIG. 3 between times $t_2$-$t_3$. If there is no noise during this event validation (confirmation) there will also be no variation within the sensor values during the measurement repetitions because the polling frequency is normally higher than 200 Hz, and the user will cause no signal variations in such a short time. So if there is a variation in the history of the repeated measurements then the variation will be caused by noise. Thus, the scanning frequency of the sensor can be changed until no further threshold crossing(s) is caused by the noise as shown in FIG. 3.

According to yet another embodiment, such a system is not limited to use two frequency, even in most cases two operating frequencies may be sufficient. Other embodiments may use more than two operating frequencies to provide even more choices in case the other frequencies are disturbed. A state machine may be used to switch between a plurality of operating frequencies.

Figure 4:
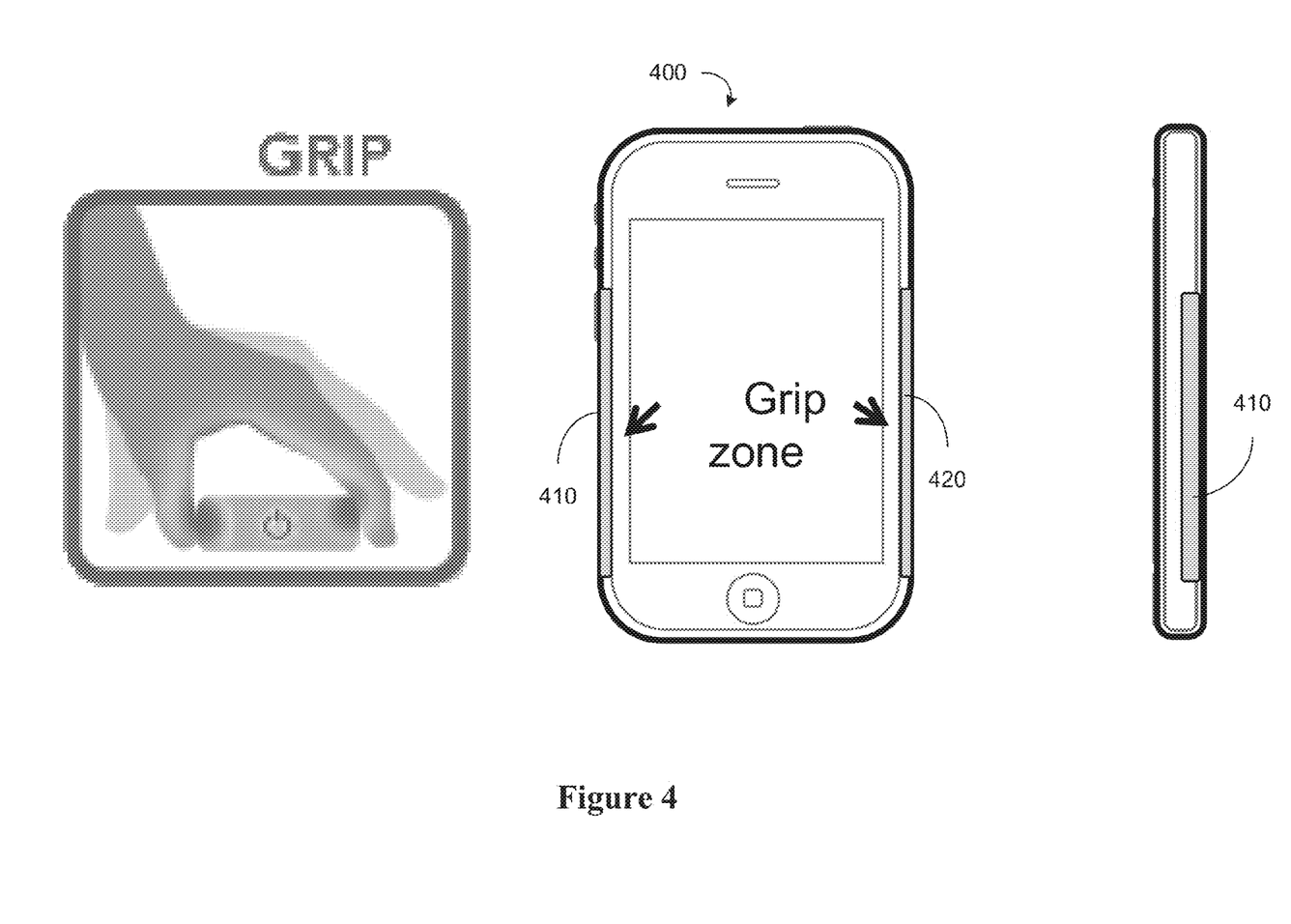
FIG. 4 shows an exemplary portable battery operated device.

Referring to FIG. 4, depicted is a user device 400, e.g., smart phone, that may be activated according to the teachings of this disclosure. Capacitive sensors 410, 420 may be embedded into the sides of the user device (Grip zone). These capacitive sensors 410, 420 may be simple electrode plates as explained above. They can be formed at the edges of a printed circuit board of the device or may be separately formed by conductive elements of the housing. These electrodes 410, 420 may be used to detect a gripping of the device and such a detection may be used to activate the device. Thus, when a portable battery operated device is in a low power or sleep mode, the first polling rate is applied and the sensor system is used to determine whether the device should be switched out of the low power mode into a normal operating mode. The first polling rate is therefore set to relative low rate, such as 5 Hz, to only require a minimum of energy, basically an amount in the range of a self discharge rate of the battery system. Once a touch has been verified, the device turns itself on to operate in its "normal" operating mode. The device is not restricted to a mobile phone as shown in FIG. 4, but can be applied to any portable device, in particular a portable device that usually is activated when gripped by a user, such as a computer mouse, a remote control, etc.

The noise robustness of these capacitive sensors 410, 420 against radiated and conducted noise, e.g., switching battery chargers, CFL, light dimmers, etc., is substantially improved by using the teachings of this disclosure. Enough improvement to easily pass EMC standard IEC61000-4-6 for grip detection. In addition, the current consumption remains low, the program code size is keep small, the capacitive sensor sensitivity remains the same whether in a no noise or high noise environment, and the sensor reaction time remains fast.

Figure 5:
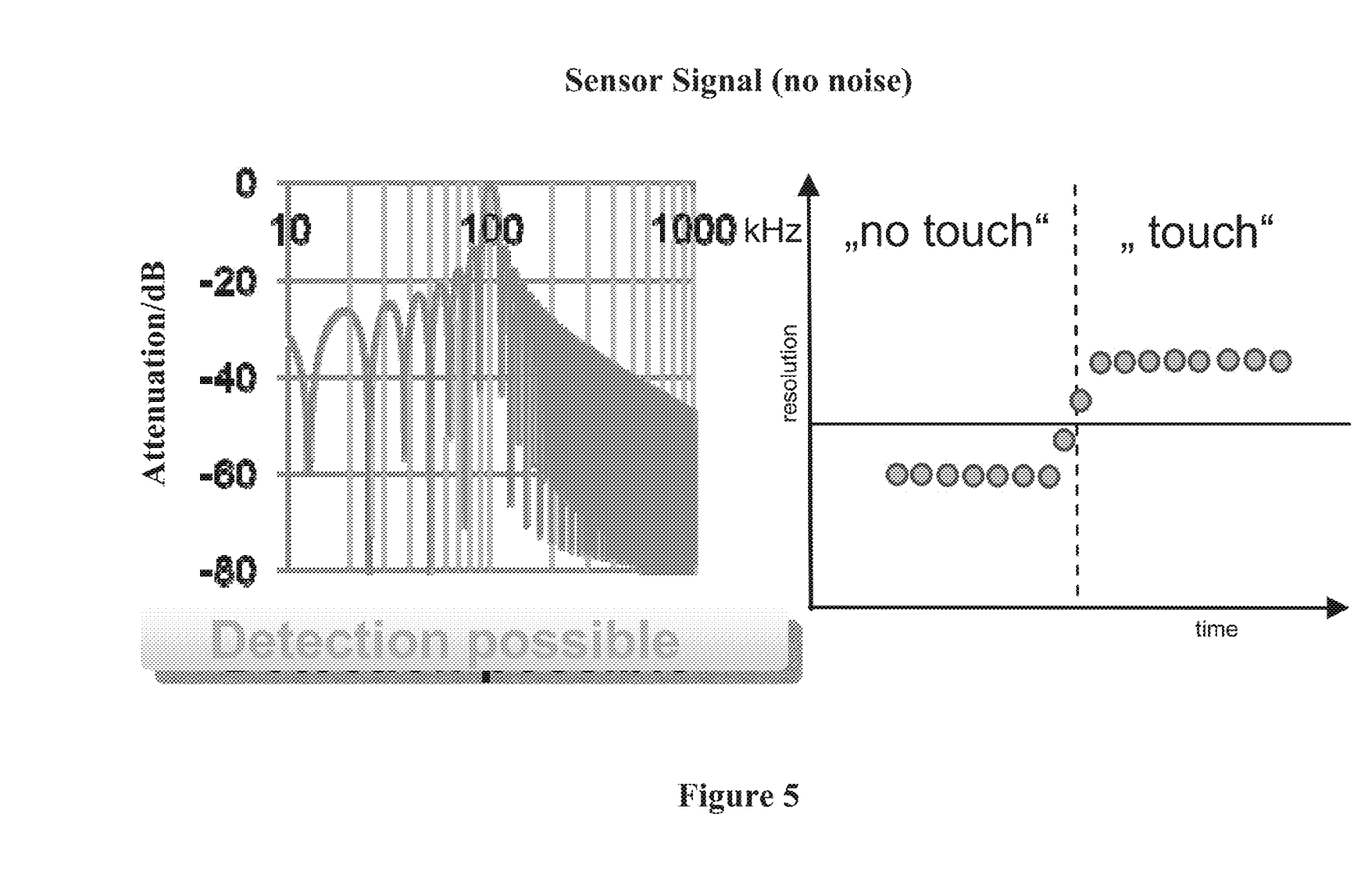
FIG. 5 shows data polling using the first filter frequency with no noise.
Figure 6:
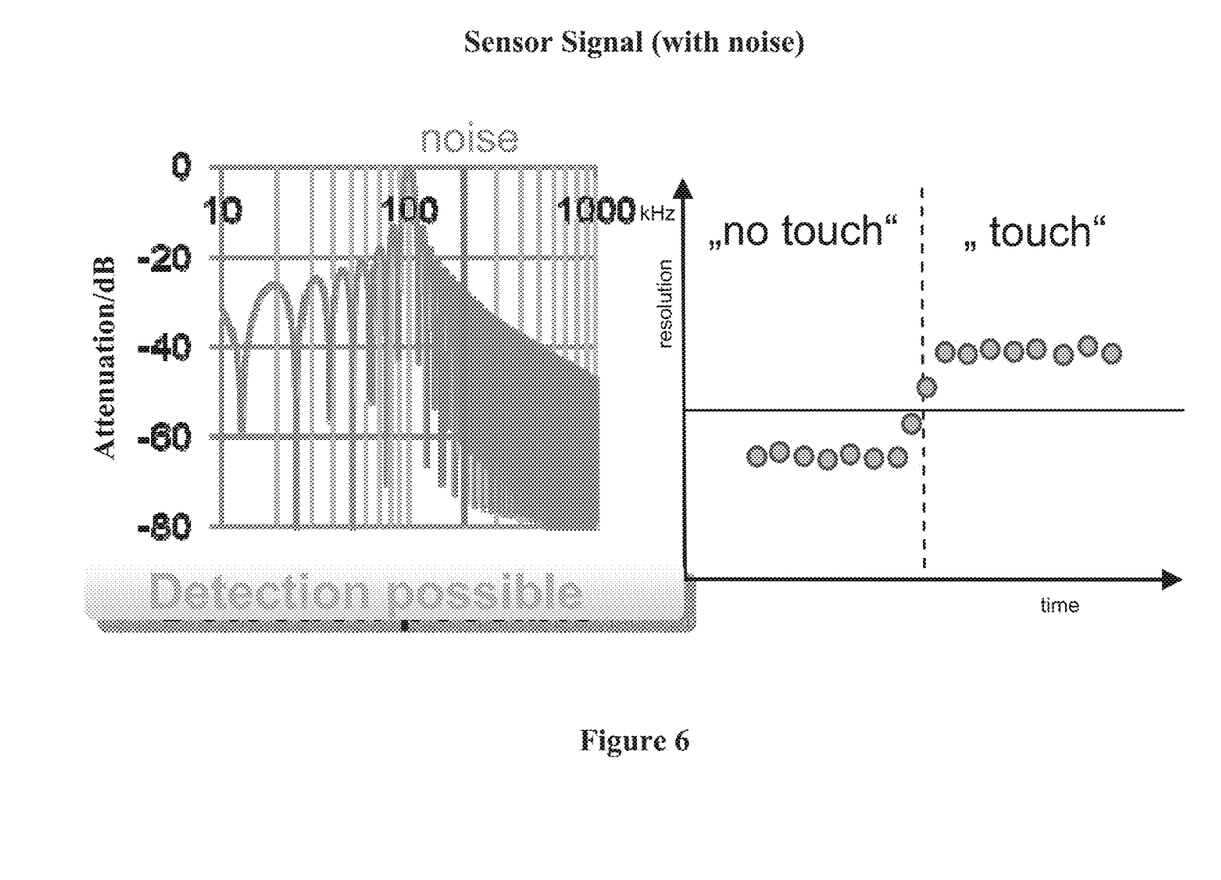
FIG. 6 shows data polling using the first filter frequency with noise outside the bandwidth of the filter.

Schematic graphs of a sensor signal without noise is shown in FIG. 5 and a sensor signal with noise is shown in FIG. 6. The history of sensor detection samples is clear and unambiguous so that no-touch/touch detection is possible. This is due to the fact that the noise as shown in FIG. 6 is at enough of a different frequency than the carrier frequency of the sensor system so that the noise does not substantially affect the history samples.

Figure 7:
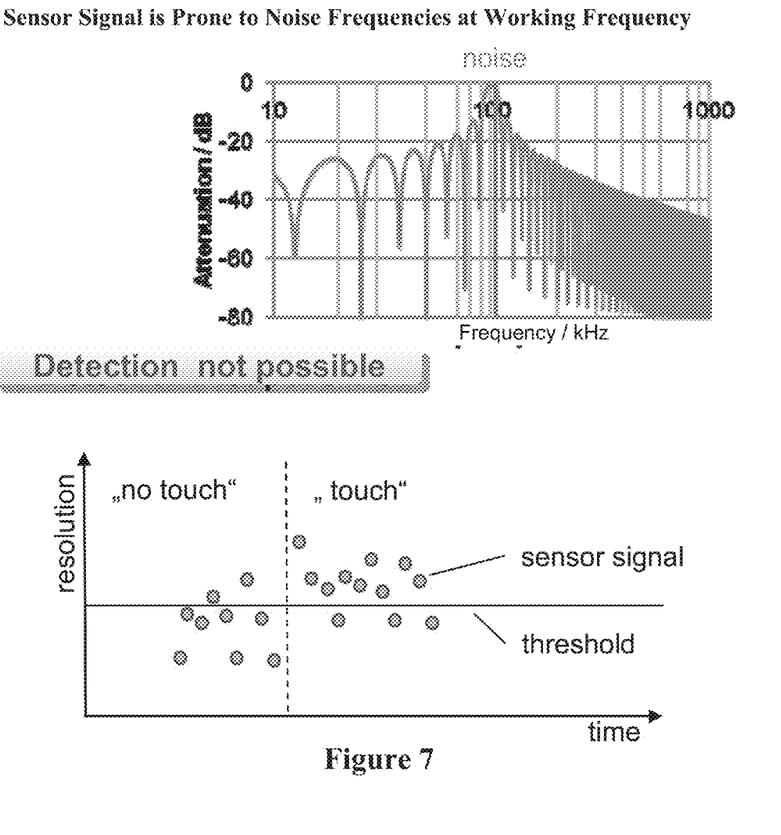
FIG. 7 shows data polling using the first filter frequency with noise inside the bandwidth of the filter.

Referring to FIG. 7, depicted is a schematic graph of a sensor signal having noise at substantially the same frequency as the scanning frequency being used by the touch sensor. The noise causes the history samples to be randomly above and below the threshold value for both no-touch and touch histories. This randomness in the history of the samples makes it impossible to discern whether there is a touch or no-touch. Thus by moving the scanning frequency away from the noise frequency, touch detection may easily be determined again as shown in FIG. 6.

Figure 8:
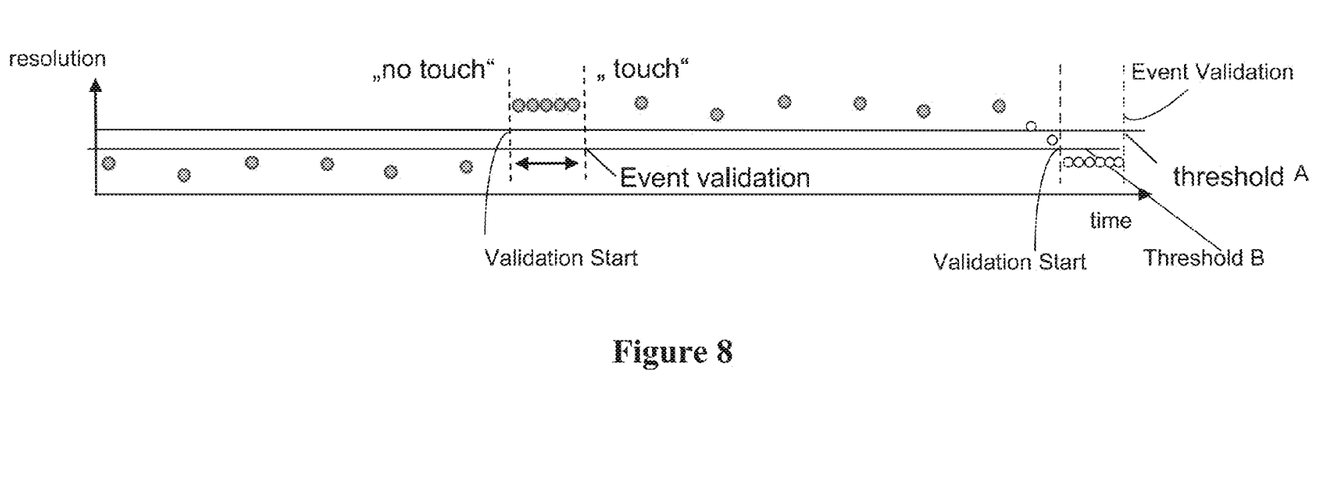
FIG. 8 shows the timing of polling sensor data during normal polling and verification polling with hysteresis.

FIG. 8 depicts a validation event for no-touch/touch determination with hysteresis. Again, at the validation event there may be a high signal acquisition repetition rate where there should be no signal variation caused by user interaction with the sensor to validate the touch event. To switch from the first to the second state the threshold may be set to threshold A. If there is a signal variation during the validation event then the operating frequency of the system should be changed to move away from the noise interference. In this case as explained above the carrier frequency of the sensor system is switched along with the filter frequency of the band-pass filter. This may be determined by having a predefined limit as to how much the signal may vary during the validation period. Once a "touch" has been determined the threshold may be switched to a second threshold B. Thus, a portable device could be automatically switched off once the "no-touch" state has been determined. However, once the "no-touch" transition has been determined, a timer could also be set to maintain an on status for a predetermined time and only switch the device to a sleep operating mode if no touch occurs until the timer expired.

Figure 9:
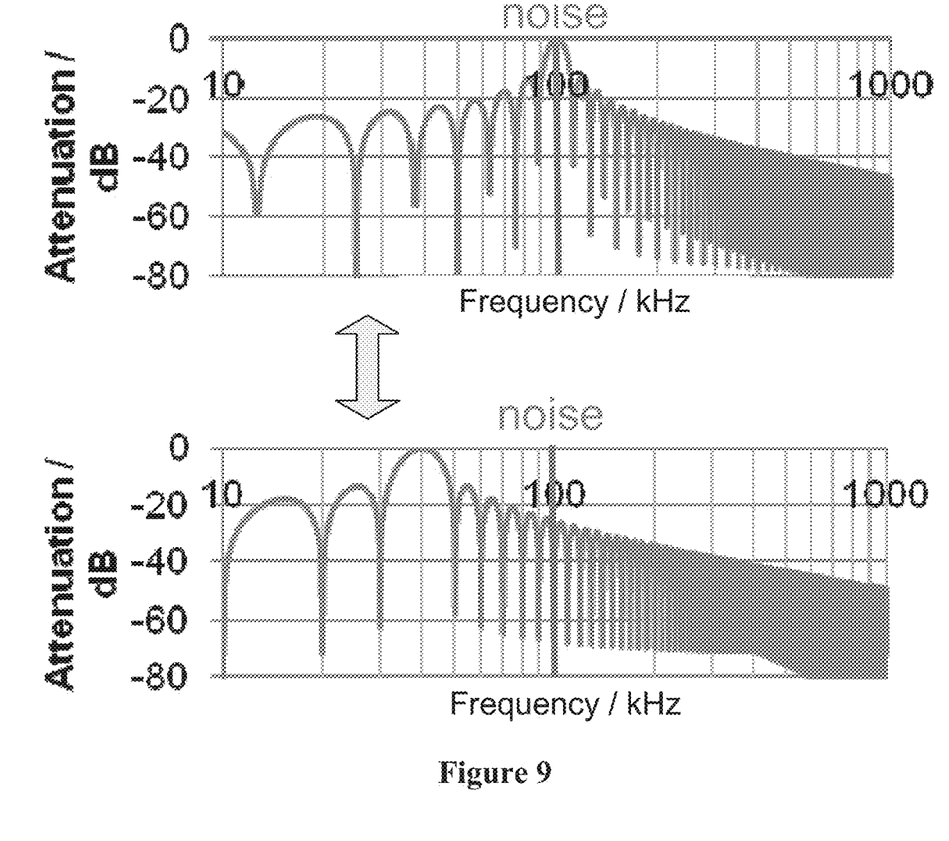
FIG. 9 shows the switching between different filters when noise is present.

FIG. 9 depicts a frequency amplitude graph where the system operating frequency has been moved sufficiently to avoid the noise frequency when polling the sensor. According to other embodiments using two frequencies, a fixed and a variable system operating frequency may be used. For example, the fixed frequency may be set at 100 kHz and a variable frequency may be set by the system to be sufficiently different from the fixed frequency to allow for a undisturbed operation of the system. For example, an oscillator with a controllable frequency, such as a voltage controlled oscillator, may be used to change the frequency of the system according to various embodiments.

Figure 10:
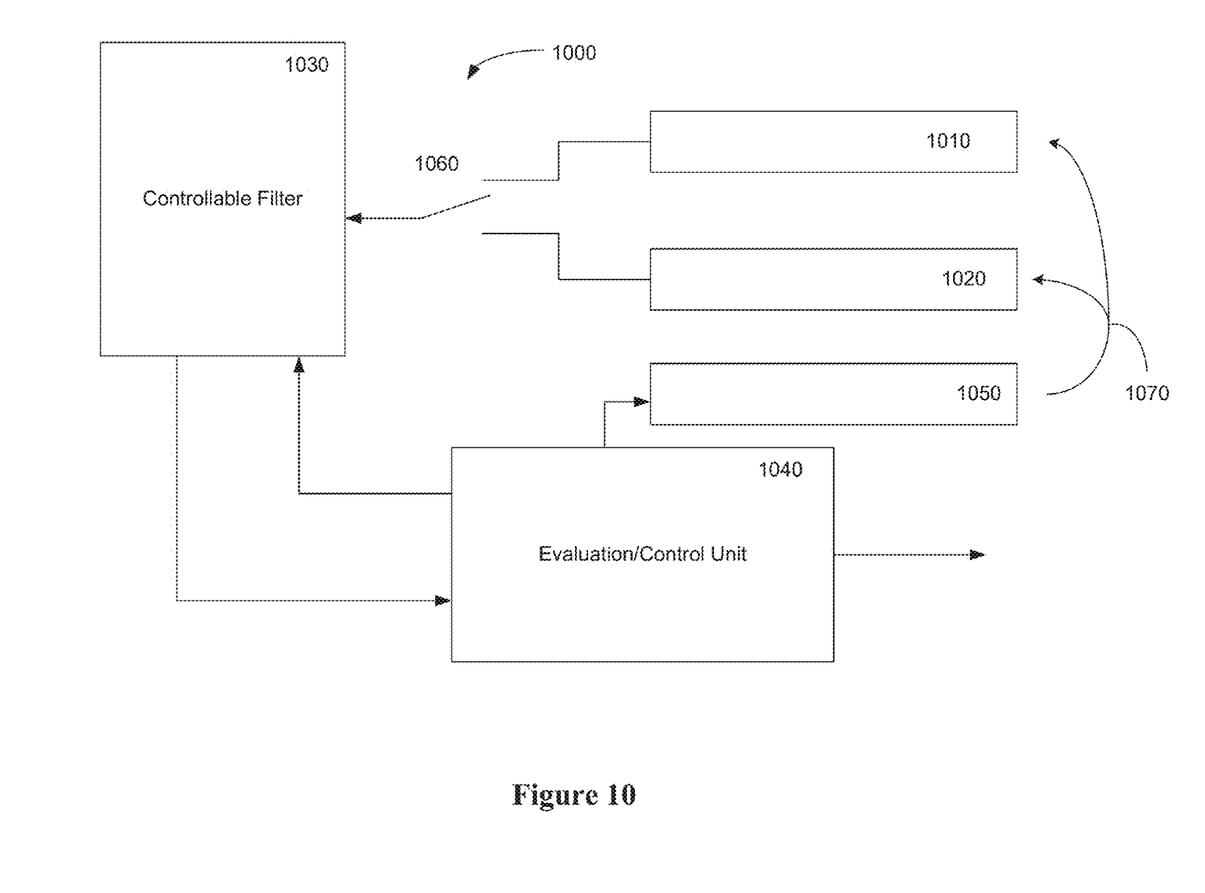
FIG. 10 shows a block diagram of a sensor system according to an embodiment.

FIG. 10 shows an embodiment of a sensor system using a transmission electrode 1050 and for example, two receiving electrodes 1010 and 1020. However, a single receiving electrode 1010 or a plurality of receiving electrodes may be used according to other embodiments. Moreover, additional electrodes used for compensation and shielding may be used according to various embodiments. Transmission electrode 1050 can be used to generate a quasi-static alternating electric field between transmission electrode 1050 and receiving electrodes 1010, 1020 as indicated by the arrows 1070. FIG. 10 shows a multiplexer 1060 to switch between the two receiving electrodes 1010 and 1020. The output of the multiplexer is coupled with the input of a controllable band-pass filter 1030. An evaluation/control unit 1040 receives the output signal of the controllable band-pass filter 1030 and provides a control signal for switching or changing the band-pass filter frequency. Furthermore, evaluation/control unit 1040 may include the oscillator for generating the carrier frequency which is fed to transmitter electrode 1050. In some embodiments, instead of an oscillator a microcontroller may generate square wave signal having a respective frequency at one of its ports which may be further amplified and fed to the transmission electrode 1050. The receiving electrodes 1010, 1020 may be used to measure a disturbance in the quasi-static electric field 1070. However, the principles of the present application are not limited to this specific measurement technique. Other capacitive sensor systems may be based on different measurement techniques using a carrier frequency. For example, other measurement techniques may analyze an attenuation of a sensor signal using a carrier frequency in a different way. Also, no dedicated transmitter-receiver principle is required.

The system shown in FIG. 10 is capable to control the filter to switch its band-pass frequency and adapt the carrier frequency of the sensor transmission signal fed to transmission electrode 1050. To this end, a controllable band-pass filter 1030 may be used. Alternatively, two separate filters using a multiplexer may be used.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for improving robustness of a capacitive sensor system, said method comprising the steps of:
   a) operating the capacitive sensor system wherein received discrete sensor signals are filtered by a band-pass filter having a band-pass having a first center frequency;
   b) polling subsequent discrete sensor data at a first polling rate using the sensor system, wherein a sensor state is determined to be off when a received sensor signal is below a predetermined threshold and the sensor state is determined to be on when the received sensor signal is above the predetermined threshold;
   c) determining whether a polled discrete sensor value with respect to a previous discrete sensor value is transitioning from a first state to a second state or from a second state to a first state;

d) upon determining a transition:
 d1) polling subsequent discrete sensor data at a second polling rate being higher than the first polling rate using the sensor system for a predetermined time period;
 d2) verifying during the predetermined time period that the subsequent discrete sensor data polled at the second polling rate are consistent;
 d3) upon verifying that the subsequent discrete sensor data polled at the second polling rate are inconsistent, repeating at least step d2) wherein said band-pass filter is controlled to have a second center frequency and when it is determined that the subsequent discrete sensor data polled at the second polling rate are consistent continuing with step b).

2. The method according to claim 1, wherein the sensor system is configured to be operated at a system frequency that matches a center frequency of the band-pass filter and further operable to switch between the first and a second system frequency that match said first and second center frequency, respectively.

3. The method according to claim 2, wherein a system frequency is the first or second frequency, respectively.

4. The method according to claim 2, wherein s system frequency is within a pass-band of the band-pass filter.

5. The method according to claim 2, wherein the sensor system comprises a proximity sensor comprising a first transmission electrode receiving a carrier signal having the first or second frequency.

6. The method according to claim 1, further including repeating steps b)-d) upon verifying that the discrete sensor data polled at the second polling rate are inconsistent in step d3).

7. The method according to claim 1, wherein upon verifying that the discrete sensor data polled at the second polling rate are consistent, then changing a state of a sensor output signal.

8. The method according to claim 1, wherein different threshold values are applied when determining a switch from the first state to the second state and a switch from the second state to the first state.

9. The method according to claim 1, wherein the sensor output signal indicates a touch or no-touch.

10. The method according to claim 1, wherein a first polling rate is between 20 ms and 200 ms or between 10 ms and 100 ms.

11. The method according to claim 10, wherein a second polling rate is lower than 10 ms.

12. The method according to claim 1, further comprising a reception electrode, wherein a quasi-static alternating electric field is formed between the transmission electrode and the reception electrode and an attenuation of the signal at the reception electrode is measured.

13. A capacitive sensor system comprising:
 a capacitive sensor electrode arrangement;
 a band-pass filter receiving discrete sensor signals from said capacitive sensor electrode arrangement, wherein the band-pass filter having a band-pass with a first center frequency;
 an evaluation unit configured:
 to poll discrete sensor data at a first polling rate using the capacitive sensor electrode arrangement, wherein a sensor state is determined to be off when a received sensor signal is below a predetermined threshold and the sensor state is determined to be on when the received sensor signal is above the predetermined threshold;
 determine whether a polled sensor value with respect to a previous discrete sensor value is transitioning from a first state to a second state or form the second state to the first state and upon determining a transition:
 to poll discrete sensor data at a second polling rate being higher than the first polling rate using the sensor system for a predetermined time period;
 to verify during the predetermined time period that discrete sensor data polled at the second polling rate are consistent and upon verifying that the discrete sensor data polled at the second rate are inconsistent, to control the band-pass filter to switch to a second center frequency and when it is determined that the subsequent discrete sensor data polled at the second rate are consistent continuing to poll discrete sensor data at the first polling rate.

14. The system according to claim 13, wherein a sensor output signal changes states upon verifying that the discrete sensor data polled at the second polling rate are consistent.

15. The system according to claim 14, wherein different threshold values are applied when determining a switch from the first state to the second state and a switch from the second state to the first state.

16. The system according to claim 13, wherein a system frequency is the first or second frequency, respectively.

17. The system according to claim 13, wherein a system frequency is selected to be within the band-pass of the band-pass filter.

18. The system according to claim 13, wherein the sensor output signal indicates a touch or no-touch.

19. The system according to claim 13, wherein the first polling rate is between 20 ms and 200 ms or between 10 ms and 100 ms.

20. The system according to claim 19, wherein the second polling rate is less than 10 ms.

21. The system according to claim 13, further comprising a reception electrode, wherein a quasi-static alternating electric field is formed between the transmission electrode and the reception electrode and an attenuation of the signal at the reception electrode is measured.

22. The system according to claim 13, wherein the capacitive sensor electrode arrangement is configured to operate at a variable system frequency which can be switched to match said first or second center frequency.

23. The system according to claim 13, wherein the capacitive sensor electrode arrangement comprises a proximity sensor comprising a first transmission electrode receiving a carrier signal having the first or second frequency.

24. A method for operating a portable device with a capacitive sensor system, said method comprising the steps of:
 a) switching the device into a low power mode;
 b) operating the capacitive sensor system at a first frequency, wherein received sensor signals from the reception electrode are filtered by a band-pass filter having a band-pass matching said first frequency;
 c) polling sensor data at a first rate using the sensor system operating at the first frequency;
 d) determining whether a polled sensor value is meeting a predetermined threshold;
 e) upon determining that the predetermined threshold is met:
 e1) polling sensor data at a second rate being higher than the first rate using the sensor system operating at the first frequency for a predetermined validation period;

e2) verifying during the predetermined validation period that sensor data polled at the second rate are consistent;
e3) upon verifying that the sensor data polled at the second rate are inconsistent, then repeating at least step e2) wherein the sensor system is operated at a second frequency and said band-pass filter is controlled to match said second frequency;
f) upon verifying in step e3) that the sensor data polled at the second rate are consistent, then switching the portable device from a low power mode into a normal operating mode.

* * * * *